United States Patent
Schmitt et al.

[11] Patent Number: 6,118,303
[45] Date of Patent: Sep. 12, 2000

[54] INTEGRATED CIRCUIT I/O BUFFER HAVING PASS GATE PROTECTION WITH RC DELAY

[75] Inventors: Jonathan Schmitt, Bloomington; Roger L. Roisen, Minnetrista; Iain Ross Mactaggart, Eden Prairie, all of Minn.

[73] Assignee: LSI Logic Corporation, Milpitas, Calif.

[21] Appl. No.: 09/061,972

[22] Filed: Apr. 17, 1998

[51] Int. Cl.$^7$ .............................................. H03K 19/0175
[52] U.S. Cl. ................................ 326/83; 326/57; 326/88; 326/86
[58] Field of Search ................................. 326/57, 58, 80, 326/81, 83, 86, 88

[56] References Cited

U.S. PATENT DOCUMENTS

| | | | |
|---|---|---|---|
| 5,266,849 | 11/1993 | Kitahara et al. | 307/475 |
| 5,300,832 | 4/1994 | Rogers | 307/475 |
| 5,321,324 | 6/1994 | Hardee et al. | 307/475 |
| 5,338,978 | 8/1994 | Larsen et al. | 307/443 |
| 5,381,059 | 1/1995 | Douglas | 326/58 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |
| 5,467,031 | 11/1995 | Nguyen et al. | 326/81 |
| 5,537,059 | 7/1996 | Asahina | 326/81 |
| 5,559,464 | 9/1996 | Orii et al. | 327/333 |
| 5,736,869 | 4/1998 | Wei | 326/81 |

*Primary Examiner*—Michael Tokar
*Assistant Examiner*—Anh Tran
*Attorney, Agent, or Firm*—Westman, Champlin & Kelly, P.A.

[57] ABSTRACT

An integrated circuit I/O buffer has an output driver. The output driver includes first, second and third voltage supply terminals and a pad terminal. A pad pull-up transistor is coupled in series between the first voltage supply terminal and the pad terminal and has a pull-up control terminal. A pad pull-down transistor is coupled in series between the second voltage supply terminal and the pad terminal and has a pull-down control terminal. A voltage protection transistor is coupled between the pad terminal and the pad pull-down transistor. The voltage protection transistor has a control terminal and a capacitance between the control terminal and the pad terminal. A resistor is coupled in series between the control terminal of the voltage protection transistor and the third voltage supply terminal and forms a resistor-capacitor (RC) circuit with the capacitance.

16 Claims, 4 Drawing Sheets

INTEGRATED CIRCUIT I/O BUFFER HAVING PASS GATE PROTECTION WITH RC DELAY

CROSS-REFERENCE TO RELATED APPLICATION

Cross-reference is hereby made to co-pending U.S. application Ser. No. 08/927,358, entitled "5V TOLERANT PCI I/O BUFFER ON 2.5V TECHNOLOGY," filed Sep. 9, 1997.

BACKGROUND OF THE INVENTION

The present invention relates to semiconductor integrated circuits and, more particularly, to a 5V tolerant PCI input-output (I/O) buffer which is fabricated on 2.5V technology and drives a 3.3V output signal without exceeding transistor tolerances.

CMOS integrated circuits are typically provided with tri-state I/O buffers that are selectively operable between a normal, low-impedance drive mode and a high-impedance, tri-state mode in which the buffers appear transparent to the output terminals with which they are connected. Advancements in semiconductor fabrication technology enable the geometries of semiconductor devices to be progressively reduced so that more devices can fit on a single integrated circuit. As a result, core voltages of integrated circuits are being reduced to prevent damage to the small devices and to reduce overall power consumption. For example, power supplies are now being reduced from 5V to 3.3V, and from 3.3V to 2.5V.

However, low voltage CMOS devices are often interconnected at a board level to TTL logic and other devices that operate at higher supply voltages of 5V or 3.3V. For example, buffer specifications for peripheral component interfaces (PCIs) require the buffers to be tolerant to input signals having the steady state PCI voltage, such as 5V. Also, these buffers may be exposed to reflections up to 11V or down to −5.25V for a 5V PCI voltage.

Diodes have been placed on the pad terminals of I/O buffers to clamp input spikes at or near the worst case PCI voltage, such as about 5.5V for a 5V PCI. If no further precautions are taken, a clamped 5.5V signal applied to the pad terminal of a 2.5V tri-state output buffer can cause voltage drops across the transistor devices in the buffer that exceed the transistor tolerances, which can cause the gate oxide of the devices to breakdown. It is therefore desirable to provide an I/O buffer that is tolerant to large pad voltages without exceeding the tolerance levels of the devices within the buffer.

SUMMARY OF THE INVENTION

The integrated circuit I/O buffer of the present invention has an output driver. The output driver includes first, second and third voltage supply terminals and a pad terminal. A pad pull-up transistor is coupled in series between the first voltage supply terminal and the pad terminal and has a pull-up control terminal. A pad pull-down transistor is coupled in series between the second voltage supply terminal and the pad terminal and has a pull-down control terminal. A voltage protection transistor is coupled between the pad terminal and the pad pull-down transistor. The voltage protection transistor has a control terminal and a capacitance between the control terminal and the pad terminal. A resistor is coupled in series between the control terminal of the voltage protection transistor and the third voltage supply terminal and forms a resistor-capacitor (RC) circuit with the capacitance.

DETAILED DESCRIPTION OF THE PREFERRED EMBODIMENTS

Figure 1:
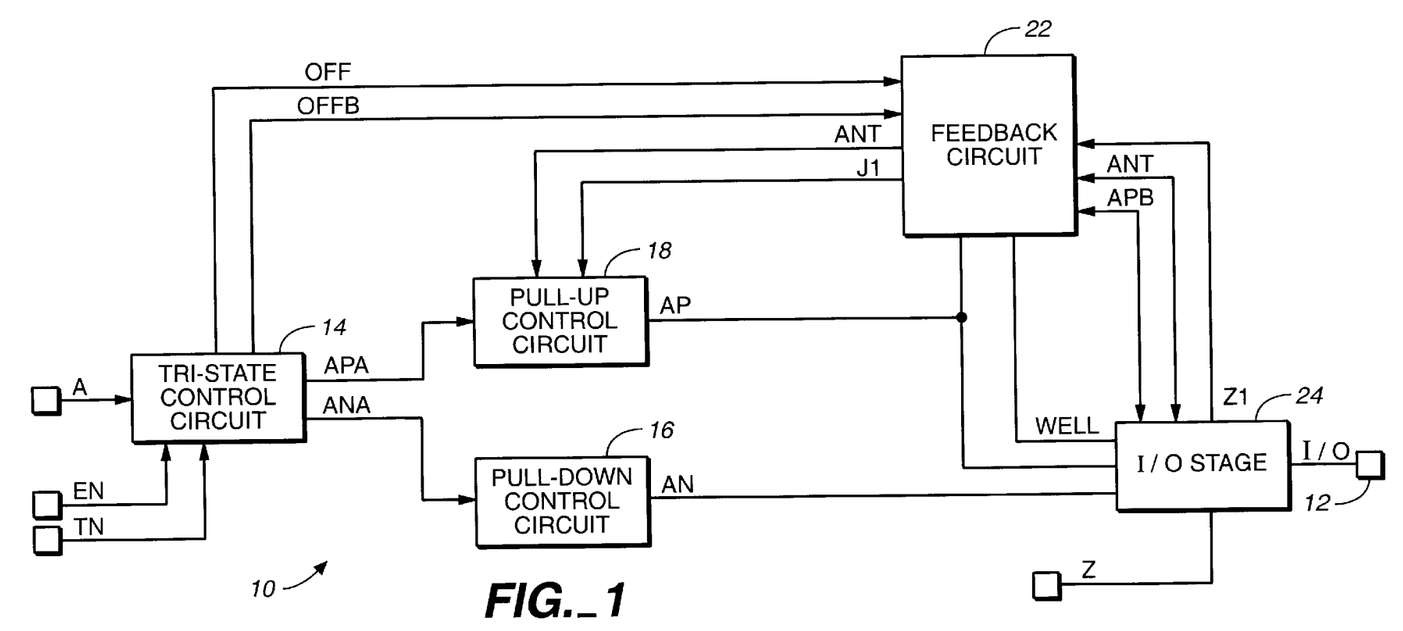
FIG. 1 is a simplified block diagram of a tri-state input-output (I/O) buffer according to one embodiment of the present invention.

FIG. 1 is a simplified block diagram of a tri-state input-output (I/O) buffer according to one embodiment of the present invention. I/O buffer 10 forms part of an integrated circuit which has been fabricated with a 2.5V CMOS fabrication process, for example. I/O buffer 10 receives a 0–2.5V data signal from the core of the integrated circuit on data terminal A and, in response, drives a 0–3.3V output signal on I/O pad 12. Also, I/O buffer 10 receives 0–5V data signals on I/O pad 12 and supplies 0–2.5V data signals on data terminal Z. Each transistor in I/O buffer 10 is biased such that: the gate-to-source and gate-to-drain voltages are all less than a 3.0V tolerance and the drain-to-source voltages are all less than a 2.75V tolerance to prevent damage to the transistors while driving or receiving signals on I/O pad 12.

I/O buffer 10 includes tri-state control circuit 14, pull-down control circuit 16, pull-up control circuit 18, feedback circuit 22 and I/O stage 24. Tri-state control circuit 14 receives a 0V–2.5V data signal on data terminal A and receives enable signals on enable terminals EN and TN. Tri-state control circuit 14 generates a 0V–2.5V pull-down control signal on terminal ANA and a 0V–2.5V pull-up control signal on terminal APA which follow the logic state of the 0V–2.5V data signal applied to data terminal A when the enable signals applied to enable terminals EN and TN are low and high, respectively. When either the enable signal on enable terminal EN is high or the enable signal on enable terminal TN is low, tri-state control circuit 14 drives the pull-down control signal on terminal APA low and the pull-up control signal on terminal ANA high.

Pull-down control circuit 16 receives the 0V–2.5V pull-down control signal on terminal ANA and generates a delayed and inverted 2.5V–0V pull-down control signal on terminal AN. Pull-up control circuit 18 receives the 0V–2.5V pull-up control signal on terminal APA and generates a level-shifted and inverted 3.3V–0.8V pull-up control signal on terminal AP. Pull-up control circuit 18 also selectively floats terminal AP to an undetermined voltage level as a function of control signals received from feedback circuit 22 on control terminal J1.

I/O stage 24 selectively pulls I/O pad 12 high substantially to 3.3V in response to a 0.8V level on pull-up control terminal AP. I/O stage 24 selectively pulls I/O pad 12 low substantially to 0V in response to a 2.5V level on pull-up control terminal AN. When the enable signal on enable terminal EN is high or the enable signal on enable terminal TN is low, the pull-up control signal on terminal AP will be 3.3V and the pull-down control signal on terminal AN will be 0V causing I/O stage 24 to operate in a tri-state or high impedance mode in which the buffer appears transparent to I/O pad 12. When in the tri-state mode, I/O stage 24 applies data signals received on I/O pad 12 to core terminal Z for processing by the integrated circuit on which I/O buffer 10 is fabricated.

Tri-state control circuit 14 also generates complementary 0V–2.5V tri-state control signals on terminals OFF and OFFB, which are provided to feedback circuit 22 for controlling various semiconductor devices within feedback circuit 22.

During the tri-state mode, feedback circuit 22 senses the voltage level on I/O pad 12 through terminal Z1 and adjusts the voltage on pull-up control terminal AP if the sensed voltage level exceeds a selected threshold, such as 3.3V, to prevent leakage current through the pull-up devices in I/O stage 24. When feedback circuit 22 senses that the voltage on I/O pad 12 exceeds the threshold voltage, feedback circuit 22 adjusts the bias levels on control terminal J1 such that pull-up control circuit 18 floats terminal AP to an undetermined voltage. In one embodiment, feedback circuit 22 passes the high voltage sensed on I/O terminal 12 to pull-up control terminal AP which ensures that the pull-up devices within I/O stage 24 remain off in the tri-state mode, thereby preventing leakage through the pull-up devices. When the sensed voltage level on I/O pad 12 is less than the threshold level, feedback circuit 22 is essentially decoupled pull-up control terminal AP.

Feedback circuit 22 also adjusts the bias level of the pull-up device substrates in I/O stage 24 through substrate bias terminal WELL. When feedback circuit 22 senses that the voltage level on I/O pad 12 is less than the threshold voltage, feedback circuit 22 sets the bias level on terminal WELL to a selected voltage, such as 3.3V. When feedback circuit 22 senses that the voltage level on I/O pad 12 exceeds the threshold voltage, feedback circuit 22 floats substrate bias terminal WELL to an undetermined voltage. This allows the substrates of the pull-up devices to rise with the voltage on I/O pad 12, as described in greater detail with reference to FIG. 4.

Tri-State Control Circuit 14

Figure 2:
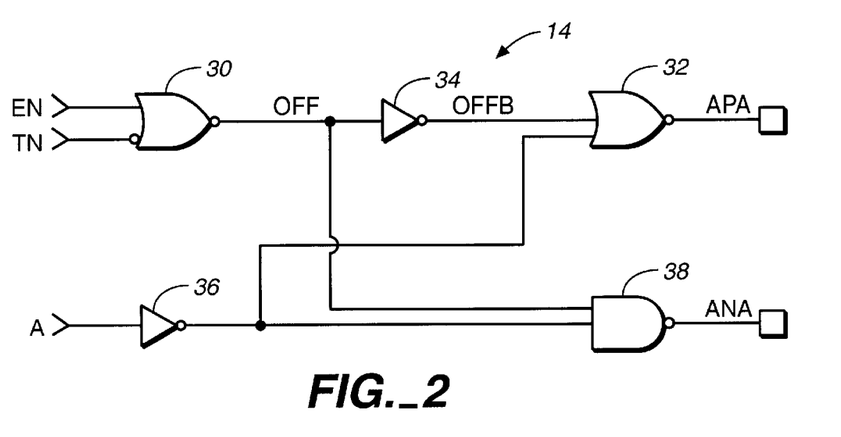
FIG. 2 is a logic diagram of tri-state control circuit within the I/O buffer shown in FIG. 1.

FIG. 2 is a logic diagram of tri-state control circuit 14. Tri-state control circuit 14 includes NOR gates 30 and 32, inverters 34 and 36 and NAND gate 38. NOR gate 30 has an active low input coupled to enable terminal EN and an active high input coupled to enable terminal TN. The output of NOR gate 30 defines tri-state control terminal OFF and is coupled to the input of inverter 34 and one of the inputs of NAND gate 38. The output of inverter 34 defines tri-state control terminal OFFB and is coupled to one of the inputs of NOR gate 32. The output NOR gate 32 is coupled to terminal APA. Data terminal A is coupled to the input of inverter 36. The output of inverter 36 is coupled to one of the inputs of NOR gate 32 and one of the inputs of AND gate 38. The output of NAND gate 38 is coupled to terminal ANA. Tri-state control terminals OFF and OFFB are provided to tri-state control voltage shifting circuit 20 and feedback circuit 22, as shown in FIG. 1.

During normal operation, the enable signal applied to enable terminal EN is low and the enable signal applied to enable terminal TN is high. Tri-state control terminals OFF and OFFB are high and low, respectively, and the data signals applied to data terminal A pass to terminals APA and ANA. When either enable terminal EN is high or enable TN is low, tri-state control terminals OFF and OFFB are low and high, respectively. NOR gate 32 drives terminal APA to a logic low state and NAND gate 38 drives terminal ANA to a logic high state.

Pull-down and Pull-up Control Circuits 16 and 18

Figure 3A:
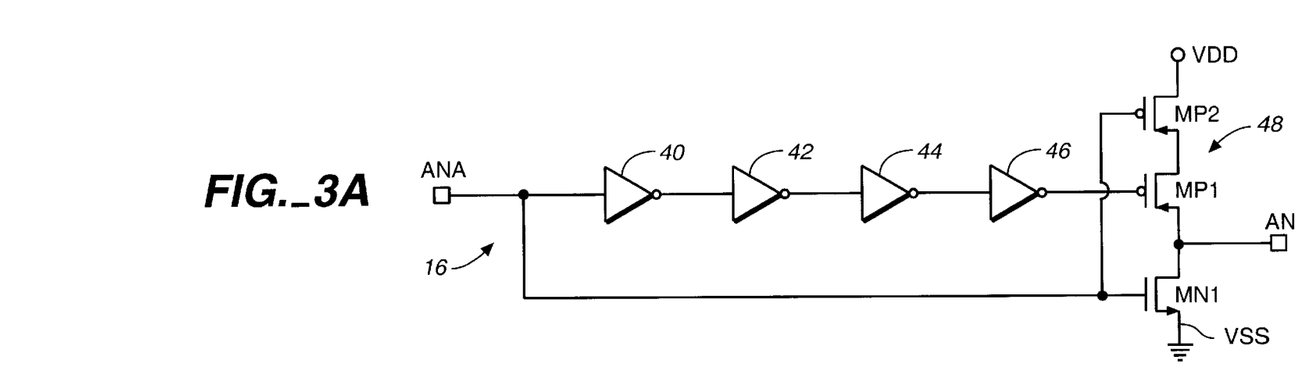
FIGS. 3A and 3B are schematic diagrams of a pull-down and a pull-up control circuit, respectively, within the I/O buffer shown in FIG. 1.
Figure 3B:
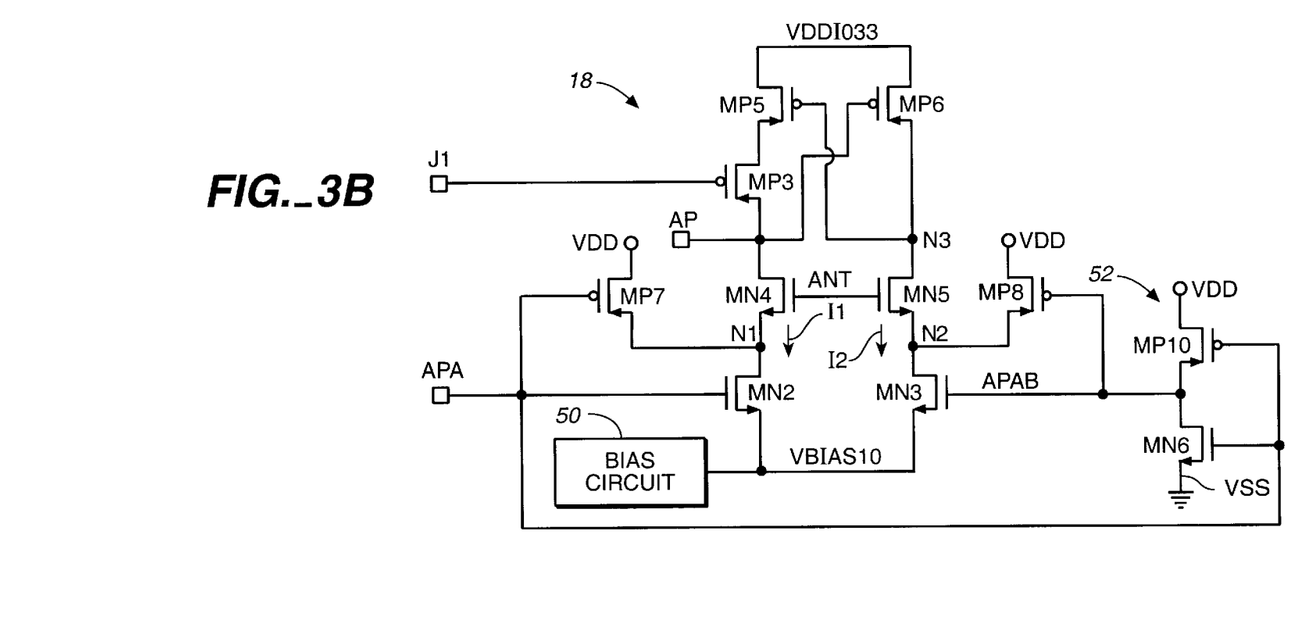

FIGS. 3A and 3B are schematic diagrams of pull-down control circuit 16 and pull-up control circuit 18, respectively. Pull-down control circuit 16 includes inverters 40, 42, 44, 46 and 48 which are coupled together in series between terminal ANA and pull-down control terminal AN. Inverter 48 includes three transistors, N-channel transistor MN1 and P-channel transistors MP1 and MP2, to allow bypassing of the delay line formed by inverters 40, 42, 44 and 46 during a low-to-high transition on terminal ANA. A high-to-low transition must pass through the delay line before pulling terminal AN high through transistors MP1 and MP2. This prevents I/O stage 24 (shown in FIG. 1) from pulling I/O pad 12 low and high at the same time, as discussed in greater detail below. Inverters 40, 42, 44, 46 and 48 are biased between voltage supply terminals VDD and VSS. Voltage supply terminals VDD and VSS are coupled to an external power supply (not shown) which provides a 2.5V core supply voltage. The pull-down control signals generated on terminal AN therefore have a voltage swing of about 0V–2.5V.

Pull-up control circuit 18 is a voltage level shifting differential amplifier and includes bias circuit 50, inverter 52, N-channel differential transistor pair MN2 and MN3, N-channel voltage protection transistors MN4 and MN5, P-channel pass gate transistor MP3, P-channel cross-coupled transistor pair MP5 and MP6 and P-channel charge boosting transistors MP7 and MP8. Bias circuit 50 generates a bias voltage of about 0.8V on voltage bias node VBIAS 10. Bias circuit 50 can include any suitable bias generator, such as a resistor tree, a biased current source, a self-fed inverter or a voltage regulator. An example of a suitable bias generator is disclosed in U.S. Ser. No. 08/906,305, filed Aug. 5, 1997 and entitled "OUTPUT BUFFER WITH REGULATED VOLTAGE BIASING FOR DRIVING VOLTAGES GREATER THAN TRANSISTOR TOLERANCE," which is assigned to the same assignee as the present application and is hereby incorporated by reference.

The pull-up control signals received on terminal APA are applied to the gate of transistor of MN2 and are applied to the gate of transistor MN3, at terminal APAB, through inverter 52. Inverter 52 includes N-channel transistor MN6 and P-channel transistor MP10 which are coupled together in series between voltage supply terminal VDD and voltage supply terminal VSS. The gates of transistors MN2 and MN3 therefore receive complementary 0V–2.5V pull-up control signals on terminals APA and APAB.

The sources of transistors MN2 and MN3 are coupled to voltage bias node VBIAS10, and the drains of transistors MN2 and MN3 define first and second current paths I1 and I2 through nodes N1 and N2, respectively. Voltage protection transistor MN4 is coupled in series between pull-up control terminal AP and node N1. Voltage protection transistor MN5 is coupled in series between nodes N2 and N3. The gates of transistors MN4 and MN5 are coupled to control terminal ANT. Pass gate transistor MP3 has a gate coupled to control terminal J1, a drain coupled to pull-up control terminal AP and a source coupled to the drain of transistor MP5. Transistors MP5 and MP6 are cross coupled with one another through pass gate transistor MP3. Transistor MP5 has a gate coupled to node N3, a drain coupled to the source of pass gate transistor MP3 and a source coupled to voltage supply terminal VDDIO33. Transistor MP6 has a gate coupled to pull-up control terminal AP, a drain coupled to node N3 and a source coupled to voltage supply terminal VDDIO33. Voltage supply terminal VDDIO33 is coupled to an external power supply (not shown) which provides a 3.3V I/O supply voltage on voltage supply terminal VDDIO33.

Charge boosting transistor MP7 is a pull-up transistor which is coupled between voltage supply terminal VDD and node N1 and is controlled by terminal APA. Charge boosting transistor MP8 is a pull-up transistor which is coupled between voltage supply terminal VDD and node N2 and is controlled by terminal APAB.

The substrates of transistors MN2–MN6 are coupled to voltage supply terminal VSS. The substrate of transistor MP3 is coupled to substrate bias terminal WELL. The substrates of transistors MP5 and MP6 are coupled to voltage supply terminal VDDIO33. The substrates of transistors MP7, MP8 and MP10 are coupled to voltage supply terminal VDD.

In drive mode, feedback circuit 22 (shown in FIG. 1) biases control terminal J1 at the voltage level or voltage bias node VBIAS10 (e.g. 0.8V) and biases control terminal ANT to the voltage level on voltage supply terminal VDD (e.g. 2.5V). Pass gate transistor MP3 is therefore on and couples the drain of transistors MN4 to the drain of transistor MP5. Pull-up control circuit 18 receives the 0V–2.5V pull-up control signal on terminal APA and generates the inverted and level shifted 3.3V–0.8V pull-up control signal on pull-up control terminal AP.

If the pull-up control signal terminal APA is high, transistor MN2 will be on and transistor MN3 will be off. Transistor MN2 pulls current through current path I1 which discharges node N1 and terminal AP toward the voltage level on voltage bias node VBIAS10, which is at about 0.8V. The voltage level on bias node VBIAS10 prevents node AP from discharging below 0.8V, which prevents an over voltage condition on transistors MP5 and MP6 that would otherwise occur with the drains of these transistors being tied to 3.3V.

The low voltage on terminal AP turns on transistor MP6 which charges nodes N2 and N3 toward 3.3V. Charge boosting transistor MP8 assists transistor MP6 in charging node N2 when the voltage on terminal APA is high. The high voltage on node N3 turns off transistor MP5. As node N2 reaches about 2.0V, transistor MN5 turns off since its gate is tied to 2.5V and thereafter prevents further charging of node N2. This prevents node N2 from reaching 3.3V and an over voltage condition with respect to the gate of transistor MN3, which is at 0V.

When the pull-up control signal on terminal APA goes low, transistor MN2 turns off and transistor MN3 turns on. Transistor MN3 discharges nodes N2 and N3 toward 0.8V. The low voltage at node N3 turns on transistor MP5, which charges node N1 and terminal AP toward 3.3V and turns off transistor MP6. Charge boosting transistor MP7 assists transistor MP5 in charging node N1 when the voltage on terminal APA is low. As node N1 reaches about 2.0V, transistor MN4 turns off since its gate is tied to 2.5V. This prevents further charging of node N1 and thereby protects transistor MN2 from an over voltage condition. Pull-up control circuit 18 therefore receives 0V–2.5V pull-up control signals on terminal APA and, in response, generate, inverted and level shifted 3.3V–0.8V pull-up control signals on terminal AP.

In the tri-state mode, when the voltage on I/O pad 12 (shown in FIG. 1) exceeds the threshold voltage, feedback circuit 22 increases the voltage on control terminal J1, which turns off pass gate transistor MP3. Since terminal APA is low in the tri-state mode, transistor MN2 is also off which results in terminal AP floating to an undetermined voltage. This allows feedback circuit 22 to drive terminal AP up to 5V as a function of the voltage on I/O pad 12.

I/O Stage 24

Figure 4:
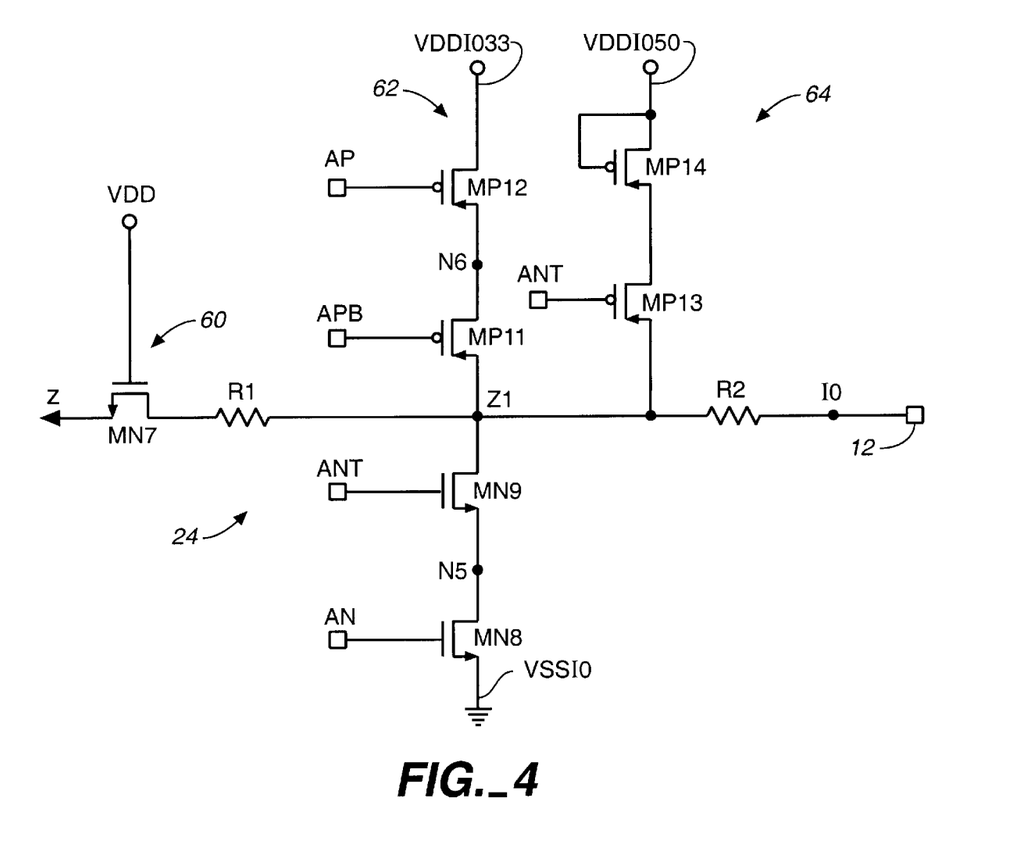
FIG. 4 is a schematic diagram of an I/O stage within the I/O buffer shown in FIG. 1.

FIG. 4 is a schematic diagram of I/O stage 24. I/O stage 24 includes input stage 60, output stage 62, polysilocon resistor R1, electrostatic discharge (ESD) protection resistor R2 and clamping diode circuit 64. Input stage 60 includes N-channel input transistor MN7 which has a gate coupled to voltage supply terminal VDD, a source coupled to core terminal Z, a drain coupled to resistor R1 and a substrate coupled to voltage supply terminal VSSIO, which is a ground terminal for voltage supply terminal VDDIO33. Resistor R1 is coupled between the drain of transistor MN7 and I/O terminal Z1. Resistor R2 is coupled between I/O terminal Z1 and I/O pad 12.

Output driver stage 62 includes N-channel pull-down transistor MN8, N-channel voltage protection transistor MN9, P-channel voltage protection transistor MP11 and P-channel pull-up transistor MP12. Pull-down transistor MN8 has a gate coupled to pull-up control terminal AN, a source coupled to voltage supply terminal VSSIO and a drain coupled to node N5. Voltage protection transistor MN9 has a gate coupled to control terminal ANT, a source coupled to node N5 and a drain coupled to I/O terminal Z1. Voltage protection transistor MP11 has a gate coupled to control terminal APB, a source coupled to node N6 and a drain coupled to I/O terminal Z1. Pull-up transistor MP12 has a gate coupled to terminal AP, a source coupled to voltage supply terminal VDDIO33 and a drain coupled to node N6. The substrates (not shown) of transistors MP11 and MP12 are coupled to substrate bias terminal WELL (shown in FIG. 1. The substrates of transistors MN8 and MN9 are coupled to voltage supply terminal VSSIO. Several output driver stages are often coupled together in parallel to provide extra drive strength through I/O pad 12 and to provide ESD protection.

Clamping diode circuit 64 includes P-channel voltage protection transistor MP13 and pull-up transistor MP14 which are coupled in series between I/O terminal Z1 and voltage supply terminal VDDIO50. Voltage protection transistor MP13 has a gate coupled to control terminal ANT, a drain coupled to I/O terminal Z1 and a source coupled to the drain of pull-up transistor MP14. Pull-up transistor MP14 is coupled as a diode with its gate and source coupled to voltage supply terminal VDDIO50. The substrates (not shown) of transistors MP13 and MP14 are coupled to a substrate bias terminal WELL. Voltage supply terminal VDDIO50 is coupled to an external voltage supply (not shown) which provides a 5V supply voltage on voltage supply terminal VDDIO50.

In the drive mode, feedback circuit 22 drives substrate bias terminal WELL to about 3.3V, control terminal APB is driven to about 0.8V by feedback circuit 22 (shown in FIG. 1). The high voltage on terminal WELL turns off transistor MP14 in unused output driver 64. The pull-down and pull-up control signals on terminals AN and AP pull I/O pad 12 down substantially to 0V or up substantially to 3.3V through output driver stage 62, depending on the logic state of the data signals received on data terminal A (shown in FIGS. 13). Pull-down transistor MN8 is driven with a voltage level of DV-2.5V while pull-up transistor MP12 is driven with a shifted voltage level of 0.8V–3.3V. This protects pull-down transistor MN8 and pull-up transistor MP12 from gate-to-source, gate-to-drain and gate-to-bulk voltage drop of greater than 3.0V.

When terminal AP is low at 0.8V, pull-up transistor MP12 turns on and charges node N6, I/O terminal Z1 and node N5 toward 3.3V. Terminal AN is high at 2.5V, which turns off pull-down transistor MN8. As node N5 reaches about 2.0V, voltage protection transistor MN9 turns off since its gate is tied to 2.5V. This prevents further charging of node N5, which protects pull-down transistor MN8 from an over voltage condition. Since control terminal APB is at 0.8V in the drive mode, the gate-to-source, gate-to-drain and gate-to-bulk voltages of transistor MP11 are kept to less than the transistor tolerance of 3.0V when node N6 and I/O pad 12 are charged to 3.3V.

When pull-up control terminal AP goes high to 3.3V, pull-up transistor MP12 turns off. The delay line formed by inverters 40, 42, 44, 46 and 48 (shown in FIG. 3A) prevent pull-down control terminal AN from going high until pull-up transistor MP12 has turned off. This prevents transistors MP12 and MN8 from being on at the same time. Pull-down transistor MN8 turns on and discharges node N5, I/O terminal Z1 and node N6 toward 0V. As rode N6 drops below the voltage on the gate of voltage protection transistor MP11, transistor MP11 turns off preventing further discharge of node N4 and an over voltage condition on pull-up transistor MP12.

In the tri-state mode, data signals received on I/O pad 12 are transmitted through input transistor MN7 to core terminal Z. Pull-down control circuit 16 (shown ir. FIG. 3A) drives terminal AN to 0V and pull-up control circuit 18 (shown in FIG. 3B) drives terminal AP to 3.3V. Transistors MN8 and MP12 turn off, which isolates I/O terminal Z1 and I/O pad 12 from voltage supply terminals VDDIO33 and VSSIO.

For a 5V peripheral component interface (PCI) application, I/O stage 24 must be capable of tolerating a steady 5V data signal on I/O pad 12 and voltage spikes of up to 11V. Pull-up transistor MP14 acts as a clamping diode which clamps voltage spikes on I/O terminal 12 to about 5.5V. This protects the semiconductor devices within I/O stage 24 from voltages above 5.5V. Voltage protection transistor MP13 operates similar to voltage protection transistor MP11 to protects pull-up transistor MP14 from an over voltage condition when the voltage on I/O terminal Z1 exceeds 3.3V.

In addition, feedback circuit 22 increases the voltage on control terminal APB from about 0.8V to about 2.5V, which protects transistor MP11 from gate-to-source voltage drops of greater than 3.0V when the data on I/O terminal Z1 is greater than 3.3V. When the voltage on I/O terminal Z1 exceeds 3.3V, such as when receiving 5V data signals, feedback circuit 22 also passes the high voltage on I/O terminal Z1 to pull-up control terminal AP. This ensures that the voltage on terminal AP is high enough that pull-up transistor MP12 remains off when high voltages are applied to I/O terminal Z1 and thereby prevents leakage current from flowing through transistor MP12 to voltage supply terminal VDDIO33.

Control terminals ANT and APB at the gates of voltage protection transistors MN9 and MP11 have a significant amount of coupling capacitance to I/O terminal Z1. Voltage spikes on I/O terminal Z1 therefore are capacitively coupled to ANT and APB, causing the voltages on these control terminals to follow the voltage on I/O terminal Z1. In accordance with one embodiment of the present invention, feedback circuit 22 couples a resistor in series between voltage supply terminal VDD and control terminals ANT and APB, in tri-state mode. The resistor and the coupling capacitances between I/O terminal Z1 and control terminals ANT and APB form a resistor-capacitor (RC) circuit having a time constant which delays ANT and APB from returning to the 2.5V level on voltage supply terminal VDD. By allowing the gates of voltage protection transistors MN9 and MP11 at terminals ANT and APB to rise with the drains of the transistors at I/O terminal Z1 in response to a voltage spike and then delaying the return of the gates to 2.5V at VDD until after the voltage spike has disappeared, this prevents more than 3V from appearing across the gates and drains of voltage protection transistors MN9 and MP11.

Feedback Circuit 22

Figure 5:
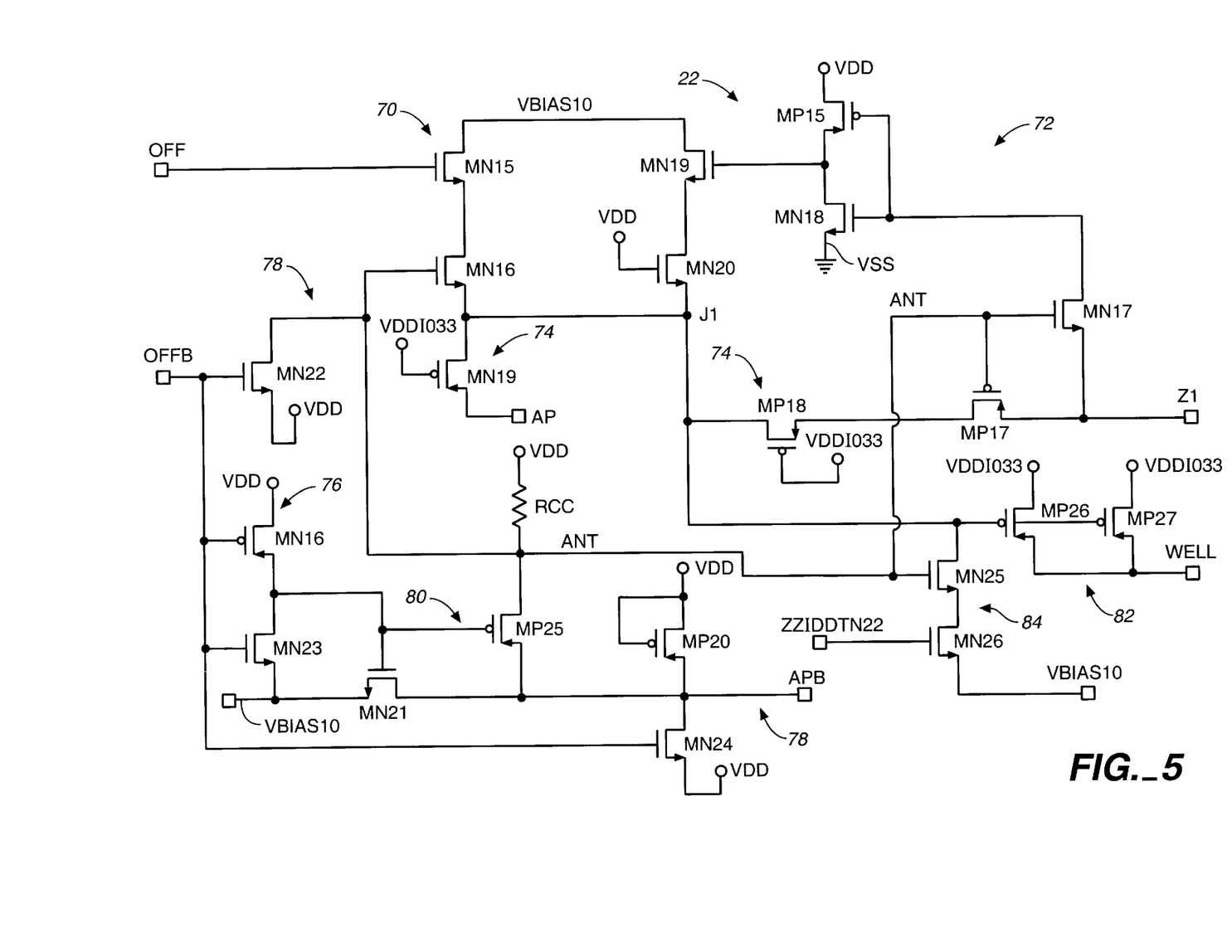
FIG. 5 is a schematic diagram of a feedback circuit within the I/O buffer shown in FIG. 1.

FIG. 5 is a schematic diagram of feedback circuit 22. Feedback circuit 22 includes drive mode bias circuit 70, low feedback circuit 72, high feedback circuit 74, RC delay resistor RCC, pass gate bias circuit 76, clamp circuit 78, APB bias circuit 80, substrate bias circuit 82 and leakage control circuit 84. Drive mode bias circuit 70 is coupled between voltage bias terminal VBIAS10 and control terminal J1. Drive mode bias circuit 70 includes N-channel bias transistor MN15 and N-channel voltage protection transistor MN16 for selectively pulling control terminal J1 to the voltage level on voltage bias terminal VBIAS10 in the drive mode. In the drive mode, tri-state control signal on terminal OFF is at 2.5V, which turns on N-channel bias transistor MN15. N-channel bias transistor MN16 is also on since its gate is pulled to 2.5V through RC delay resistor RCC.

Low feedback path 72 includes N-channel voltage protection transistor MN17, N-channel pull-down transistor MNN18, P-channel pull-up transistor MP15, N-channel bias transistor MN19 and N-channel voltage protection transistor MN20. Low feedback circuit 72 is coupled between I/O terminal Z1 and control terminal J1 for selectively pulling control terminal J1 to the voltage level on voltage bias terminal VBIAS10 in the tri-state mode when the voltage on I/O terminal Z1 is less than the threshold voltage.

High feedback circuit 74 includes P-channel voltage protection transistor MP17, P-channel pass gate transistor MP18 and P-channel pass gate transistor MP19. Voltage protection transistor MP17 and pass gate transistor MP18 are coupled together in series between I/O terminal Z1 and control terminal J1. Pass gate transistor MP19 is coupled in series between control terminal J1 and pull-up control terminal AP. High feedback circuit 74 selectively feeds the voltage on I/O terminal Z1 back to control terminal AP when the buffer is in the tri-state mode and the voltage on I/O terminal Z1 exceeds the threshold level.

Pass gate bias circuit 76 includes N-channel voltage protection transistor MN23 and P-channel voltage protection transistor MP16 which are coupled together in series between voltage supply terminal VDD and voltage bias node VBIAS10. The gates of transistors MN23 and MP16 are controlled by tri-state control terminal OFFB. The drains of transistors MN23 and MP16 are coupled to the gates; of pass gate transistors MN21 and MP25 of APB bias circuit 80. The gates of pass gate transistors MN21 and MP25 are selectively pulled low toward the voltage on voltage bias node VBIAS10 (which is at about 0.8V) through voltage protection transistor MN23 instead of toward 0V directly by tri-state control terminal OFFB. This prevents the voltage from the gate-to-drain and from the gate-to-source of transistors MN21 and MP25 from exceeding 3V when the voltages on control terminals ANT and APB rise above 2.5V.

Clamp circuit 78 includes N-channel transistors MN22 and MN24 and P-channel transistor MP20. Clamp transistor MN22 is coupled in series between voltage supply terminal VDD and control terminal J1 and has a gate coupled to tri-state control terminal OFFB. In tri-state mode, the gate and drain of transistor MN22 are at 2.5V. If the voltage on control terminal ANT falls below 2.5V, transistor MN22 turns on and clamps ANT so that it does not fall much below 2.5V. Similarly, clamp transistor MP20 clamps control terminal APB to a voltage not much more than 2.5V. Transistor MP20 has a gate and source coupled to voltage supply terminal VDD and a drain coupled to control terminal APB. If the voltage on control terminal APB rises above 2.5V, transistor MP20 turns on and clamps the voltage on control terminal APB. Clamp transistor MN24 is coupled in series between control terminal APB and voltage supply terminal VDD and has a gate coupled to tri-state control terminal OFFB. In tri-state mode, the gate and source of transistor MN24 are both at 2.5V. If the voltage on control terminal APB drops below 2.5V, transistor MN24 turns on and clamps the voltage on control terminal APB.

APB bias circuit 80 includes N-channel pass gate transistor MN21 and P-channel pass gate transistor MP25 which selectively couple control terminal APB to the voltage on voltage bias node VBIAS10, when in the drive mode, or the voltage on voltage supply terminal VDD through RC delay resistor RCC, when in the tri-state mode. Transistor MN21 is coupled in series between voltage bias terminal VBIAS10 and control terminal APB. The gate of transistor MN21 is coupled to the drains of voltage protection transistors MN23 and MP16. Transistor MP25 is coupled in series between control terminal ANT and control terminal APB. The gate of transistor MP25 is coupled to the drains of voltage protection transistors MN23 and MP16. In the drive mode, tri-state control terminal OFFB is at 0V, voltage protection transistor MP16 is on and pulls the gates of pass gate transistors MN21 and MP25 to 2.5V. Pass gate transistor MN21 is on and sets the voltage on control terminal APB to 0.8V. Pass gate transistor MP25 is off. In the tri-state mode, tri-state control terminal OFFB is at 2.5V, voltage protection transistor MN23 is on and pulls the gates of pass gate transistors MN21 and MP25 to 0.8V. Pass gate transistor MP25 is on and sets the voltage on control terminal APB to 2.5V through RC delay resistor RCC. Pass gate transistor MN21 is off.

Substrate bias circuit 82 includes P-channel pull-up transistors MP26 and MP27 which are coupled together in parallel between voltage supply terminal VDDIO33 and substrate bias terminal WELL. The gates of transistors MP26 and MP27 are coupled to control terminal J1. Substrate bias circuit 82 sets the voltage on substrate bias terminal WELL to 3.3V when control terminal J1 is below 3.3V and floats substrate bias terminal WELL to an undetermined voltage when control terminal J1 is above 3.3V to prevent over voltage conditions when various transistors in feedback circuit 22 and I/O stage 24 experience high voltages from I/O pad IO.

The substrates of transistors MN15–MN20, MN22–MN23 and MN25–MN26 are coupled to voltage supply terminal VSS. The substrate of transistor MP25 is coupled to voltage supply terminal VDD. The substrates of transistors MN21, MP–MP20 and MP26–MP27 are coupled to substrate bias terminal WELL.

Leakage control circuit 84 includes N-channel transistors MN25 and MN26 which are coupled in series between control terminal J1 and voltage bias node VBIAS10. The gate of transistor MN25 is coupled to control terminal ANT, and the gate of transistor MN26 is coupled to test enable terminal ZZIDDTNZZ. In the normal drive and tri-state modes, test enable terminal ZZIDDTNZZ is at about 2.5V. In a current drain test mode test enable terminal ZZIDDTNZZ is at about 0V. Transistor MN26 therefore normally couples the source of transistor MN25 to voltage bias node VBIAS10. When the voltage on I/O terminal Z1 is above the threshold voltage, and high feedback circuit 74 pulls control terminal J1 high, transistor MN25 is off, leaving control terminal J1 decoupled from voltage bias node VBIAS10. When the voltage on I/O terminal Z1 is below the threshold voltage, and low feedback circuit 72 pulls control terminal J1 low, transistor MN25 turns on and couples control terminal J1 to voltage bias node VBIAS10. For example, if I/O pad IO is coupled to an external bus, I/O buffer 10 switches from the drive mode to the tri-state mode, and an external driver coupled to the bus begins driving the bus to 3.3V, control terminal J1 is not allowed to float and eventually discharge to ground. Rather, it is tied to VBIAS10. Therefore, if another External driver then begins driving the bus to 5V, there will be no over voltage condition across the transistors in high feedback circuit 74.

Overall Operation of Feedback Circuit 22

1. Drive Mode

During operation, when I/O buffer 10 is in the drive mode, tri-state control terminal OFF is at 2.5V and tri-state control terminal OFFB is at 0V. Bias transistor MN15 turns on and pulls control terminal J1 low through transistor MN16 to the voltage level on voltage bias terminal VBIAS10, which is at 0.8V. The low voltage on control terminal J1 turns on substrate bias transistors MP26 and MP27 which pull substrate bias terminal WELL to 3.3V. Referring to FIG. 4, with substrate bias terminal WELL at 3.3V, the substrates of transistors MP11 and MP12 in output driver stage 62 are biased to drive I/O pad 12 selectively to either 0V and 3.3V.

Referring back to FIG. 5, within high feedback circuit 74, the gate of pass gate transistor MP18 is a 3.3V. As long as the voltage on I/O terminal Z1 is less than a threshold voltage above 3.3V, pass gate transistor MP18 remains off and decouples I/O terminal Z1 from bias terminal J1. The gate of pass gate transistor MP19 is also at 3.3V. With control terminal J1 at 0.8V, pass gate transistor MP19 is off and decouples pull-up control terminal AP from control terminal J1.

In APB bias circuit 80, the 0V level on terminal OFFB turns on transistor MP16 and turns off transistor MN23. Transistor MP16 pulls the gates of pass gate transistors MN21 and MP25 to 2.5V, which turns on transistor MN21 and turns off transistor MP25. Transistor MN21 pulls control terminal APB to the voltage level on voltage bias terminal VBIAS10, which is at about 0.8V. Control terminal ANT is pulled to 2.5V through 11C delay resistor RCC.

Referring to FIG. 3B, with control terminal J1 at 0.8V and control terminal ANT at 2.5V, pass gate transistor MP3 is on and pull-up control circuit 18 functions normally to generate inverted and level shifted pull-up control signals on pull-up control terminal AP in response to data signals received on terminal APA.

Referring to FIG. 4, the pull-up and pull-down control signals on pull-up and pull-down control terminals AP and AN selectively pull I/O terminal Z1 to 3.3V and 0V, respectively in response to the data signals. Control terminals APB and ANT are biased at 0.8V and 2.5V, respectively, for passing the data from pull-up and pull-down transistors MP12 and MN8.

2. Tri-State Mode $V_{Z1}<2.5V$

Referring back to FIG. 5, when I/O buffer 10 is in the tri-state mode, tri-state control terminal OFF is at 0V and tri-state control terminal OFFB is at 2.5V. The low voltage on terminal OFF turns off transistor MN15 bias circuit 70. If the voltage on I/O terminal Z1 is less than the threshold voltage, which is about 2.5V for example, low feedback circuit 72 is enabled and high feedback circuit 74 is disabled. The gate of voltage protection transistor MN17 is pulled to about 2.5V through RC delay resistor RCC, and transistor MN17 turns on. The low voltage on I/O terminal Z1 is passed through voltage protection transistor MN17 and discharges the gates of pull-up transistor MP15 and pull-down transistor MN18. Pull-up transistor MP15 and pulls the gate of bias transistor MN19 high toward 2.5V. Bias transistor MN19 turns on and pulls control terminal J1 toward the voltage level on voltage bias terminal VBIAS10, which is about 0.8V. With control terminal J1 at 0.8V, substrate bias transistors MP26 and MP27 remain on and continue to pull substrate bias terminal WELL to 3.3V.

With tri-state control terminal OFFB at 2.5V, transistor MN23 is on and transistor MP16 is off. Transistor MN23 discharges the gates of pass gate transistors MN21 and MP25. Pass gate transistor MN21 turns off and pass gate transistor MP25 turns on. Transistor MP25 couples APB control terminal to control terminal ANT, which is coupled to voltage supply terminal VDD through RC delay resistor VDD. Control terminals ANT and APB are now both coupled to RC delay resistor RCC, which forms an RC circuit with the gate-to-drain capacitances of voltage protection transistors MN9 and MP11 in I/O stage 24 (shown in FIG. 4). Any voltage spikes experienced by I/O terminal Z1 are capacitively coupled to control terminals ANT and APB. Control terminals ANT and APB therefore tend to follow changes in the voltage on I/O terminal Z1. The RC circuit formed by the coupling capacitance and resistor RCC has a time constant which is preferably at least as long as the expected duration of the voltage spikes. This limits the rise in the gate-to-drain voltages or gate-to-source voltages in response to voltage spikes in I/O terminal Z1. In one embodiment, the time constant is preferably at least 50 nanoseconds and most preferably at least 62 nanoseconds. Resistor RCC has a resistance which is preferably 5K Ohms to 100K Ohms and most preferably 20K Ohms to 100K Ohms. RC delay resistor RCC is formed by a low-doped well region on the integrated circuit, for example.

Referring to FIG. 3B, with control terminal J1 at 0.8V and control terminal ANT at 2.5V, pass gate transistor MP3 remains on such that pull-up control circuit L8 operates in a normal tri-state mode in which the circuit pulls pull-up control terminal AP high to about 3.3V (since terminal APA is held at 0V). Referring to FIG. 3A, terminal ANA is held to 2.5V which pulls pull-down control terminal AN to 0V. The 2.5V level on terminal APA and the 0V level on terminal ANA turn off pull-up and pull-down transistors MP12 and MN8 in I/O stage 24 (shown in FIG. 4) which decouples output driver 62 from I/O terminal Z1.

Referring back to FIG. 5, within high feedback circuit 74, transistor MP17 is off since its gate is tied to 2.5V through control terminal ANT and its source is tied to less that 2.5V through I/O terminal Z1. Pass gate transistor MP18 is also off since its gate is tied to 3.3V. Transistors MP17 and MP18 therefore isolate control terminal J1 from I/O terminal Z1 in high feedback circuit 74. Pass gate transistor MP19 is also off since its gate is at 3.3V and its drain at control terminal J1 is at 0.8V.

3. Tri-State Mode, $V_{Z1}>2.5V$

When the voltage on I/O terminal Z1 exceeds the threshold voltage of 2.5V, such as when receiving a 5V data signal from I/O pad 12, low feedback circuit 72 is disabled and high feedback circuit 74 is enabled. In low feedback circuit 72, the high voltage on I/O terminal Z1 charges the gate of pull-down transistor MN18 through transistor MN17 until it reaches an NMOS threshold voltage below the gate of voltage protection transistor MN17, which is at 2.5V. Thereafter, voltage protection transistor MN17 turns off which protects transistor MN18 from over voltage condition since its source is at 0V. Transistor MP15 turns off and transistor MN18 turns on, which discharges the gate of bias transistor MN19. Bias transistor MN19 turns off and isolates bias terminal J1 from voltage bias terminal VBIAS10.

With the voltage on I/O terminal Z1 exceeding 2.5V and the gate of voltage protection transistor MP17 at 2.5V and the gate of pass gate transistor MP18 at 3.3V, transistors MP17 and MP18 turn on and feed the voltage on I/O terminal Z1 to control terminal J1. The high voltage on control terminal Z1 also turns off substrate bias transistors MP26 and MP27 allowing substrate bias terminal WELL to float to an undetermined voltage. Substrate bias terminal WELL can then be driven high through the drain-to-substrate NP junction of voltage protection transistor MP11 (shown in FIG. 4).

Referring to FIG. 3B, the high voltage on terminal J1 turns off pass gate transistor MP3 which allows pull-up control terminal AP to float to an undetermined voltage and be driven by high feedback circuit 74. Referring back to FIG. 5, when control terminal J1 reaches a threshold voltage above 3.3V, pass gate transistor MP19 turns on which passes the high voltage on bias terminal J1 to pull-up control terminal AP, which ensures that pull-up transistor MP12 (shown in FIG. 1) remains off so there is no leakage current through pull-up transistor MP12.

Since the transistors in feedback circuit 22 are fabricated in a 2.5V process, the high 5V level on I/O terminal Z1 and control terminal J1 requires the addition of several voltage protection transistors along each leg of feedback circuit 22 to prevent over voltage conditions. For example, when the voltage on bias terminal J1 exceeds 2.0V, voltage protection transistors MN16 and MN20 turn off since their gates are tied to 2.5V. This isolates transistors MN15 and MN19 from the high 5V signal which prevents voltage drops across the transistors that would exceed their tolerance. Likewise, transistor MN17 protects pull-down transistor MN18 from an over voltage condition when I/O terminal Z1 is high. Transistor MP17 protects pass gate transistor MP18 when I/O terminal Z1 is at 0V.

The tri-state output driver of the present invention is tolerant to a steady 5V input signal and drives a 3.3V output signal on I/O pad 12 while the semiconductor devices within the driver are tolerant only to 3V from gate-to-source, gate-to-drain or gate-to-bulk and 2.75V from source-to-drain. The tri-state output driver of the present invention is also capable of accepting voltage spikes of up to 11V through the use of an RC delay formed with a resistor and the coupling capacitances at the gates of the voltage protection transistors in the output driver stage. As a result, the tri-state output buffer of the present invention is can be used on a 2.5V integrated circuit to interface with a 5V PCI buffer. The gate lengths of any transistors with risky drain-to-source voltages can be elongated for additional tolerance. In an alternative embodiment, control terminal APB is coupled to a resistor which is separate from resistor RCC.

Although the present invention has been described with reference to preferred embodiments, workers skilled in the art will recognize that changes may be made in form and detail without departing from the spirit and scope of the invention. For example, the present invention can be implemented with various technologies, including CMOS, and can have a variety of circuit configurations. The transistors shown in the figures can include individual transistors or an array of transistors coupled together in parallel with one another. Also, the voltage supply terminals can be relatively positive or relatively negative, depending upon the particular convention adopted and the technology used and can include a power supply bus or a biased reference terminal having a voltage other than that of the power supply buses, for example. The terms "pull-up" and "pull-down" used in the specification and the claims are arbitrary terms and can refer either to a logic high level or a logic low level depending upon the relative levels of the voltage supply terminals. Likewise, the term "coupled" can include various types of connections or couplings and can include a direct connection or a connection through one or more intermediate components.

What is claimed is:

1. An integrated circuit output driver comprising:
   first, second and third voltage supply terminals;
   a pad terminal;
   a pad pull-up transistor coupled in series between the first voltage supply terminal and the pad terminal and comprising a pull-up control terminal;
   a pad pull-down transistor coupled in series between the second voltage supply terminal and the pad terminal and comprising a pull-down control terminal;
   a first voltage protection transistor coupled in series between the pad terminal and the pad pull-down transistor and comprising a first control terminal and a capacitance between the first control terminal and the pad terminal; and
   a resistor coupled in series between the first control terminal and the third voltage supply terminal and forming a resistor-capacitor (RC) circuit with the capacitance, which has a time constant of at least 50 nanoseconds, wherein the resistor has a resistance of 5K Ohms to 100K Ohms.

2. The integrated circuit output driver of claim 1 and further comprising:
   a second voltage protection transistor coupled in series between the pad terminal and the pad pull-up transistor and comprising a second control terminal and a capacitance between the second control terminal and the pad terminal;
   a voltage bias node;
   a pass gate circuit comprising a first selectively conductive path between the second control terminal and the voltage bias node and an alternative, second selectively conductive path between the second control terminal and the resistor.

3. The integrated circuit output driver of claim 2 and further comprising:
   a voltage clamping circuit coupled between the second control terminal and the third voltage supply terminal.

4. The integrated circuit output driver of claim 2 and further comprising:
   a voltage clamping circuit coupled between the first control terminal and the third voltage supply terminal.

5. A tri-state buffer for use in an integrated circuit, the tri-state buffer comprising:
   first, second and third voltage supply terminals;
   a core terminal;
   a pad terminal;
   an enable terminal for receiving an enable signal having an active state and an inactive state;
   a pad pull-up transistor coupled in series between the first voltage supply terminal and the pad terminal and comprising a pull-up control terminal;
   a pad pull-down transistor coupled in series between the second voltage supply terminal and the pad terminal and comprising a pull-down control terminal;
   a pull-down control circuit coupled between the core terminal and the pull-down control terminal;
   a pull-up control circuit coupled between the core terminal and the pull-up control terminal;
   a first voltage protection transistor coupled in series between the pad terminal and the pad pull-down transistor and comprising a first control terminal and a capacitance between the first control terminal and the pad terminal; and
   a resistor coupled in series between the first control terminal and the third voltage supply terminal and forming a resistor-capacitor (RC) circuit with the capacitance.

6. The tri-state buffer of claim 5 and further comprising:
   a second voltage protection transistor coupled in series between the pad terminal and the pad pull-up transistor and comprising a first control terminal and a capacitance between the second control terminal and the pad terminal;
   a voltage bias node;
   a pass gate circuit comprising a first selectively conductive path between the second control terminal and the voltage bias node and an alternative, second selectively conductive path between the second control terminal and the resistor.

7. The tri-state buffer of claim 6 and further comprising:
   a voltage clamping circuit coupled between the second control terminal and the third voltage supply terminal.

8. The tri-state buffer of claim 6 and further comprising:
   a voltage clamping circuit coupled between the first control terminal and the third voltage supply terminal.

9. The tri-state buffer of claim 5 and further comprising:
   feedback means coupled between the pad terminal and the pull-up control terminal for sensing a first voltage on the pad terminal and for adjusting a second voltage on the pull-up control terminal based on the sensed first voltage to reduce leakage current through the pad pull-up transistor when the enable signal is in the inactive state.

10. The tri-state buffer of claim 9 wherein the feedback means comprises:
    pass gate means for passing the sensed first voltage from the pad terminal to the pull-up control terminal when the sensed first voltage exceeds a threshold level.

11. The tri-state buffer of claim 9 and further comprising:
    a substrate bias node;
    wherein the pad pull-up transistor and the first voltage protection transistor each comprise a substrate terminal which is coupled to the substrate bias node; and
    wherein the feedback means comprises means for (1) biasing the substrate bias node at a substrate bias voltage when (a) the enable signal is in the active state and (b) the enable signal is in the inactive state and the sensed first voltage on the pad terminal is less than a threshold level; and (2) floating the substrate bias node to an undefined voltage when the enable signal is in the inactive state and the sensed first voltage on the pad terminal exceeds the threshold level.

12. The tri-state buffer of claim 11 wherein the feedback means further comprises:

a P-channel substrate pull-up transistor which is coupled to the substrate bias node and has a control terminal;

a high feedback path comprising pass gate means for passing the first voltage from the pad terminal to the control terminal of the P-channel substrate pull-up transistor so as to bias the P-channel substrate pull-up transistor in an off state only when the enable signal is in the inactive state and the first voltage on the pad terminal exceeds the threshold level; and a low feedback path comprising bias means for biasing the P-channel substrate pull-up transistor in an on state when (1) the enable signal is in the active state and (2) the enable signal is in the inactive state and the first voltage on the pad terminal is less than the threshold level.

13. The tri-state buffer of claim 9 wherein the pull-up control circuit comprises a voltage level shifting differential amplifier.

14. The tri-state buffer of claim 13 wherein the voltage level shifting differential amplifier comprises decoupling means for decoupling the pull-up control circuit from the pull-up control terminal of the pad pull-up transistor when the enable signal is in the active state and the sensed first voltage on the pad terminal exceeds a threshold level.

15. A method of operating a tri-state buffer having a driver stage with a pull-up protection transistor and a pull-down protection transistor coupled between an input-output pad terminal and a pad pull-up transistor and a pad pull-down transistor, respectively, wherein the control terminals of the pull-up and pull-down transistors capacitively couple to the pad terminal when the voltage on the pad terminal switches logic states, the method comprising:

biasing the pad pull-up and pad pull-down transistors to selectively couple the pad terminal to first and second complementary voltages when the tri-state buffer is in a low-impedance drive mode;

biasing the pad pull-up and pad pull-down transistors to operate the pad pull-up and pad pull-down transistors in an off state when the tri-state buffer is in a high-impedance mode;

coupling the control terminal of the pull-down protection transistor to a third supply voltage through a resistor, wherein the third voltage is less than the first voltage and greater than the second voltage;

coupling the control terminal of the pull-up protection transistor to a fourth voltage, which is less than the third voltage and greater than the second voltage, when the tri-state buffer is in the low-impedance drive mode; and coupling the control terminal of the pull-up protection transistor to the third voltage through the resistor when the tri-state buffer is in the high-impedance mode.

16. A method of operating a tri-state buffer having a driver stage with a pull-up protection transistor and a pull-down protection transistor coupled between an input-output pad terminal and a pad pull-up transistor and a pad pull-down transistor, respectively, wherein the control terminals of the pull-up and pull-down transistors capacitively couple to the pad terminal during a voltage spike received on the pad terminal, the method comprising:

biasing the pad pull-up and pad pull-down transistors to selectively couple the pad terminal to first and second complementary voltages when the tri-state buffer is in a low-impedance drive mode;

biasing the pad pull-up and pad pull-down transistors to operate the pad pull-up and pad pull-down transistors in an off state when the tri-state buffer is in a high-impedance mode;

coupling the control terminals of the pull-up and pull-down protection transistors to respective bias voltages which tend to rise to respective elevated voltages during the voltage spike; and holding the control terminals of the pull-up and pull-down voltage protection transistors at the respective elevated voltages during the entire voltage spike and then returning the control terminals of the pull-up and pull-down voltage protection transistors to the respective bias voltages.

* * * * *